US008500953B2

(12) United States Patent
Chang et al.

(10) Patent No.: US 8,500,953 B2
(45) Date of Patent: Aug. 6, 2013

(54) EDGE RING ASSEMBLY WITH DIELECTRIC SPACER RING

(75) Inventors: Jeremy Chang, Sunnyvale, CA (US); Andreas Fischer, Castro Valley, CA (US); Babak Kadkhodayan, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 232 days.

(21) Appl. No.: 12/415,114

(22) Filed: Mar. 31, 2009

(65) Prior Publication Data
US 2009/0186487 A1 Jul. 23, 2009

Related U.S. Application Data

(62) Division of application No. 11/198,296, filed on Aug. 8, 2005, now abandoned.

(51) Int. Cl.
*C23F 1/00* (2006.01)
*H01L 21/306* (2006.01)

(52) U.S. Cl.
USPC .................................. 156/345.43; 156/345.51

(58) Field of Classification Search
USPC ............. 156/345.43, 345.44, 345.45, 345.46, 156/345.47; 118/715, 722, 723 R, 723 E; 315/111.21
See application file for complete search history.

(56) References Cited

U.S. PATENT DOCUMENTS

| 4,340,462 | A | 7/1982 | Koch |
| 4,948,458 | A | 8/1990 | Ogle |
| 5,200,232 | A | 4/1993 | Tappan et al. |
| 5,667,631 | A | 9/1997 | Holland et al. |
| 5,748,434 | A | 5/1998 | Rossman et al. |
| 5,805,408 | A | 9/1998 | Maraschin et al. |
| 5,820,723 | A | 10/1998 | Benjamin et al. |
| 5,824,605 | A | 10/1998 | Chen et al. |
| 5,948,704 | A | 9/1999 | Benjamin et al. |
| 5,998,932 | A | 12/1999 | Lenz |
| 6,013,155 | A | 1/2000 | McMillin et al. |
| 6,013,984 | A | 1/2000 | Ellinger et al. |

(Continued)

FOREIGN PATENT DOCUMENTS

| CN | 1591793 A | 3/2005 |
| JP | 59-011629 | 1/1984 |

(Continued)

OTHER PUBLICATIONS

Australian Patent Office, Australian Search Report, Singapore Application No. SG 200606191-5, Applicant: Lam Research Corporation, 4 pages, Oct. 25, 2006.

(Continued)

*Primary Examiner* — Maureen Gramaglia
(74) *Attorney, Agent, or Firm* — Buchanan Ingersoll & Rooney PC

(57) ABSTRACT

An edge ring assembly surrounds a substrate support surface in a plasma etching chamber. The edge ring assembly comprises an edge ring and a dielectric spacer ring. The dielectric spacer ring, which surrounds the substrate support surface and which is surrounded by the edge ring in the radial direction, is configured to insulate the edge ring from the baseplate. Incorporation of the edge ring assembly around the substrate support surface can decrease the buildup of polymer at the underside and along the edge of a substrate and increase plasma etching uniformity of the substrate.

15 Claims, 4 Drawing Sheets

U.S. PATENT DOCUMENTS

| | | | |
|---|---|---|---|
| 6,019,060 | A | 2/2000 | Lenz |
| 6,039,836 | A | 3/2000 | Dhindsa et al. |
| 6,042,687 | A | 3/2000 | Singh et al. |
| 6,090,304 | A | 7/2000 | Zhu et al. |
| 6,140,612 | A | 10/2000 | Husain et al. |
| 6,184,158 | B1 | 2/2001 | Shufflebotham et al. |
| 6,230,651 | B1 | 5/2001 | Ni et al. |
| 6,245,192 | B1 | 6/2001 | Dhindsa et al. |
| 6,333,272 | B1 | 12/2001 | McMillin et al. |
| 6,364,957 | B1 * | 4/2002 | Schneider et al. ............ 118/728 |
| 6,383,931 | B1 | 5/2002 | Flanner et al. |
| 6,391,787 | B1 | 5/2002 | Dhindsa et al. |
| 6,426,304 | B1 | 7/2002 | Chien et al. |
| 6,475,336 | B1 | 11/2002 | Hubacek |
| 6,551,939 | B2 | 4/2003 | Takamatsu et al. |
| 6,552,296 | B2 | 4/2003 | Smith et al. |
| 6,579,465 | B1 | 6/2003 | Takamatsu et al. |
| 6,630,407 | B2 | 10/2003 | Keil et al. |
| 6,641,698 | B2 | 11/2003 | Kabansky |
| 6,746,961 | B2 | 6/2004 | Ni et al. |
| 6,805,139 | B1 | 10/2004 | Savas et al. |
| 6,824,627 | B2 | 11/2004 | Dhindsa et al. |
| 6,834,656 | B2 | 12/2004 | Quingyuan et al. |
| 6,838,012 | B2 | 1/2005 | Lenz |
| 6,852,636 | B1 | 2/2005 | O'Donnell |
| 7,014,788 | B1 | 3/2006 | Fujimura |
| 2003/0013315 | A1 | 1/2003 | Park et al. |
| 2003/0075274 | A1 | 4/2003 | Halpin et al. |
| 2007/0000614 | A1 | 1/2007 | Hatamura et al. |

FOREIGN PATENT DOCUMENTS

| | | |
|---|---|---|
| WO | WO97/11482 | 3/1997 |
| WO | WO2004/095529 A2 | 11/2004 |
| WO | WO2006/025123 | 3/2006 |

OTHER PUBLICATIONS

Australian Patent Office, Australian Written Opinion, Singapore Application No. SG 200606191-5, Applicant: Lam Research Corporation, 4 pages, Oct. 25, 2006.

International Search Report and Written Opinion dated Sep. 25, 2007 for PCT/US06/28844.

Examination Report dated Oct. 7, 2010 for Singapore Patent Appln. No. 200801092-8.

Chinese Official Action mailed Sep. 25, 2009 for Chinese Appln. No. 200680028968.9.

* cited by examiner

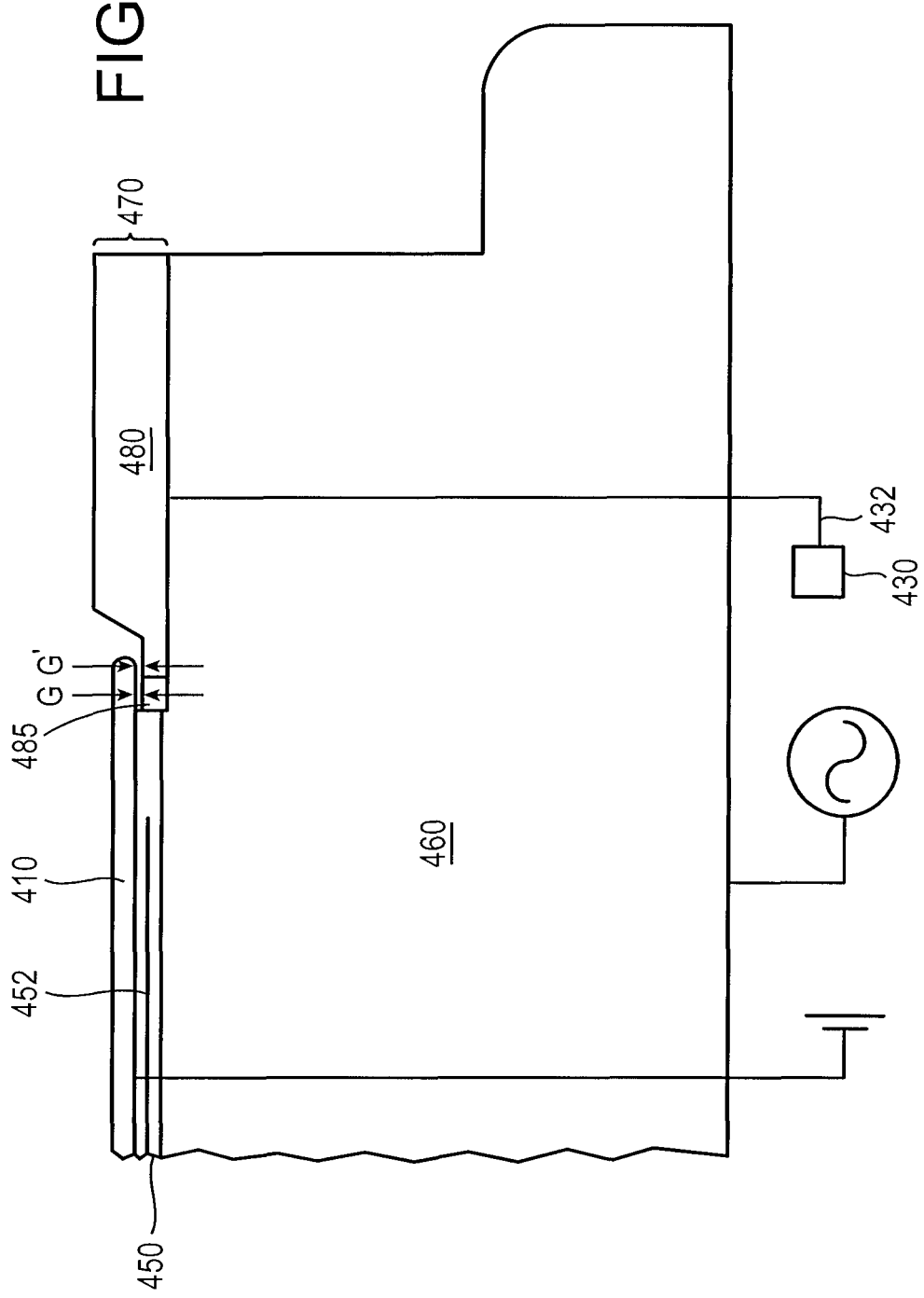

EDGE RING ASSEMBLY WITH DIELECTRIC SPACER RING

CROSS-REFERENCE TO RELATED APPLICATIONS

This application is a divisional application of U.S. application Ser. No. 11/198,296, entitled EDGE RING ASSEMBLY WITH DIELECTRIC SPACER RING, filed on Aug. 8, 2005 now abandoned, the entire content of which is hereby incorporated by reference.

BACKGROUND

In the description that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art.

In the field of semiconductor processing, plasma processing chambers are commonly used to etch one or more layers formed on a substrate. During etching, the substrate is supported on a substrate support surface within the chamber. Substrate supports can include edge rings positioned around the substrate support (i.e., around the substrate) for confining plasma to the volume above the substrate and/or to protect the substrate support, which typically includes a clamping mechanism, from erosion by the plasma. The edge rings, sometimes called focus rings, can be sacrificial (i.e., consumable) parts. Conductive and non-conductive edge rings are described in commonly-owned U.S. Pat. Nos. 5,805,408; 5,998,932; 6,013,984; 6,039,836 and 6,383,931.

Lithographic techniques can be used to form geometric patterns in a surface of a semiconductor substrate. During a lithographic process, a pattern such as an integrated circuit pattern can be projected from a mask or reticle and transferred to a photosensitive (e.g., photoresist) coating formed on a surface of the substrate. Plasma etching, in turn, can be used to transfer the pattern formed in the photoresist layer to one or more layers formed on the substrate that underlie the photoresist layer.

During plasma etching, plasma is formed above the surface of a substrate by adding large amounts of energy to a gas (or gas mixture) at low pressure. The plasma may contain ions, free radicals, and neutral species with high kinetic energies. By adjusting the electrical potential of the substrate, charged species in the plasma can be directed to impinge upon the surface of the substrate and thereby remove material (e.g., atoms) therefrom.

Plasma etching can be made more effective by using gases that are chemically reactive with the material to be etched. So called "reactive ion etching" combines the energetic etching effects of the plasma with the chemical etching effects of a reactive gas. However, during plasma etching, in addition to etching one or more layers of semiconductor material, the photoresist layer can also be removed by the plasma.

Residue from the photoresist and/or polymer that may form as an etching byproduct may undesirably redeposit on a lateral edge (e.g., bevel edge) or underside of the substrate. Bevel polymer, which may be volatilized during subsequent processing, may have an adverse effect on process yield. In order to maximize yield, reduction in polymer buildup at the underside and on the bevel edge of the substrate would be desirable.

SUMMARY

In a first embodiment, an edge ring assembly adapted to surround a substrate support surface in a plasma etching chamber comprises an edge ring dimensioned to underlie a peripheral portion of substrate located on a substrate support surface and provide a clearance gap between a lower peripheral surface of the substrate and an upper surface of the edge ring, and a dielectric spacer ring between the edge ring and the substrate support surface dimensioned so as to provide a clearance gap between a lower surface of the substrate and an upper surface of the dielectric spacer ring.

When the edge ring assembly is mounted in a plasma etching chamber, an annular gap between the edge ring and the dielectric spacer ring and/or an annular gap between the dielectric spacer ring and the substrate support surface is preferably less than 0.25 mm, and an upper surface of the dielectric spacer ring and an innermost upper surface of the edge ring are preferably substantially co-planar.

The edge ring assembly is preferably configured such that the distance between the plane of the substrate support surface and the plane of the uppermost surface of the dielectric spacer ring is less than about 0.25 mm, and the distance between the plane of the substrate support surface and the plane of the upper surface of a radially inner portion of the edge ring is less than about 0.25 mm. Thus, when a substrate is positioned on the substrate support surface, a gap between a lower surface of the substrate and an upper surface of the dielectric spacer ring is preferably less than about 0.25 mm, and a gap between a lower surface of the substrate and an upper surface of a radially inner portion of the edge ring is preferably less than about 0.25 mm. In an embodiment, a radially outer portion of the edge ring is thicker than the dielectric spacer ring.

In a further embodiment, a plasma etching chamber comprises an edge ring assembly adapted to surround a substrate support surface in the plasma etching chamber. The substrate support preferably comprises an electrostatic chuck on an upper surface of a baseplate forming a lower electrode. The edge ring assembly can overlie a coupling ring that overlies a peripheral portion of the baseplate. A substrate can be mounted on the substrate support surface such that the outer edge of the substrate overhangs the dielectric spacer ring and a radially inner portion of the edge ring.

A preferred dielectric spacer ring has a width (e.g., from about 0.5 to 2.5 mm) effective to electrically insulate the edge ring from the baseplate and a height (e.g., 1 to 3 mm) effective to minimize the deposition of polymer in a gap between the dielectric spacer ring and the substrate. At least one gas passage can extend through the coupling ring or the baseplate, the gas passage being adapted to supply a heat transfer gas to an adjacent surface of the edge ring and/or the dielectric spacer ring.

A preferred plasma etching chamber comprises a parallel plate reactor having an upper showerhead electrode facing the substrate support surface. The baseplate can comprise an RF driven electrode and/or the substrate support surface can comprise an electrostatic chuck on an upper surface of a baseplate.

The edge ring assembly is preferably adapted to reduce at least one of (i) RF coupling between the edge ring and the baseplate, (ii) arcing between the edge ring and the baseplate, and (iii) polymer deposition on an underside and/or edge of a substrate supported on the substrate support surface.

A method of etching a layer on a semiconductor substrate in a plasma etching chamber having an edge ring assembly comprises supporting the substrate on a substrate support surface positioned inside the chamber, supplying etching gas to the chamber, energizing the etching gas into a plasma state adjacent an exposed surface of the substrate, and etching one or more layers on the semiconductor substrate with the plasma. Due to plasma erosion of the dielectric spacer ring, the dielectric spacer ring can be removed from the chamber and replaced with another dielectric spacer ring after etching a predetermined number of semiconductor substrates.

According to yet a further embodiment, a dielectric spacer ring is dimensioned so as to provide a clearance gap between a lower surface of a substrate located on a substrate support surface in a plasma etching chamber and an upper surface of the dielectric spacer ring, the dielectric spacer ring being further dimensioned so as to be surrounded by an edge ring dimensioned so as to underlie the substrate and provide a clearance gap between a lower surface of the substrate and an upper surface of the edge ring.

An upper surface of the dielectric spacer ring and an innermost upper surface of the edge ring are preferably substantially co-planar when the dielectric spacer ring and the edge ring are mounted in the plasma etching chamber.

The dielectric spacer ring can be bonded to an upper surface of a coupling ring or to an upper surface of a baseplate, and either or both of the dielectric spacer ring and the coupling ring can be made of quartz. In a further embodiment, the dielectric spacer ring can comprise an axially upward-extending portion formed on a radially inner surface of a coupling ring.

BRIEF DESCRIPTION OF THE DRAWINGS

FIG. 4 shows a parallel plate plasma etch reactor comprising an edge ring assembly mounted on a baseplate according to another embodiment.

DETAILED DESCRIPTION OF PREFERRED EMBODIMENTS

Figure 1:
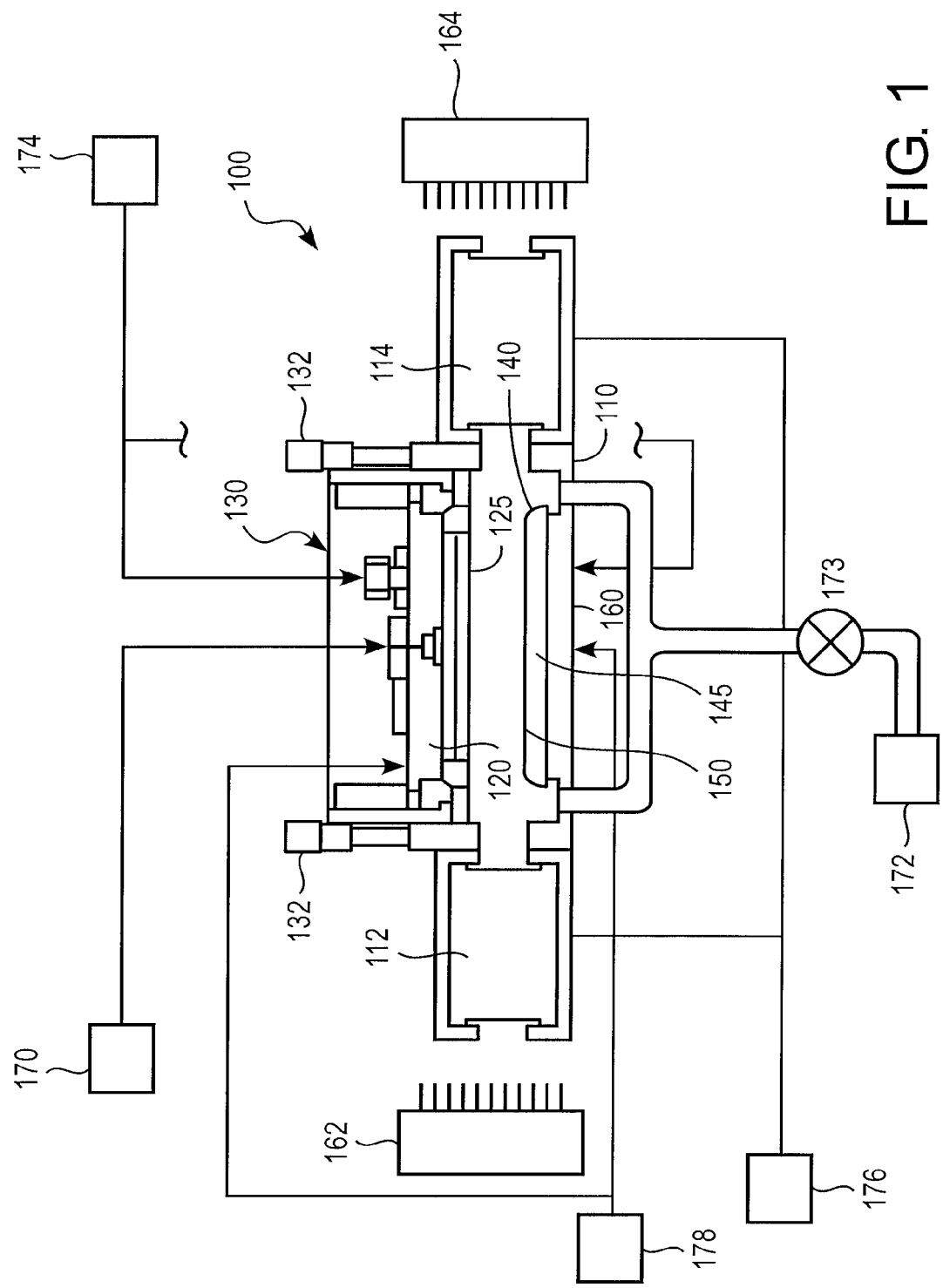
FIG. 1 is an illustration of a parallel plate plasma etch reactor.

In a parallel plate plasma etch reactor wherein process gas is supplied through a showerhead electrode and a semiconductor substrate supported on a bottom electrode is plasma etched by plasma generated by supplying RF energy to the showerhead and/or bottom electrode, plasma uniformity can be affected by RF coupling between the bottom electrode and the plasma.

To improve the plasma uniformity, an edge ring assembly surrounds a substrate support surface in the plasma etch reactor. The edge ring assembly comprises an edge ring and a dielectric spacer ring arranged such that the dielectric spacer ring surrounds the substrate support surface and the edge ring surrounds the dielectric spacer ring. Incorporation of the edge ring assembly around the substrate support surface can decrease the buildup of polymer at the underside and along the edge of a substrate and/or increase plasma etching uniformity of the substrate.

In a preferred embodiment, the dielectric spacer ring is a separate part that rests on a surface of a member that surrounds the substrate support surface. The member can be a coupling ring that underlies the dielectric spacer ring and the edge ring, or a portion of the baseplate. In an alternate embodiment, the dielectric spacer ring can be bonded to the member such as via a thermally conductive elastomer bond. In a still further preferred embodiment, the dielectric spacer ring and a coupling ring can comprise a unitary part.

By providing a dielectric spacer ring, RF coupling can be reduced between the edge ring and the baseplate. Further, as explained in more detail below, insertion of a dielectric spacer ring between the substrate support surface and the edge ring can reduce the propensity of arcing between a conductive edge ring and the substrate support/baseplate and/or reduce the deposition of polymer on the underside and/or edge of a substrate that is supported on the substrate support surface during plasma etching of the substrate. A plasma etch chamber comprises the edge ring assembly, and a method of etching a semiconductor substrate comprises etching the semiconductor substrate in a plasma etch chamber comprising the edge ring assembly.

The edge ring assembly is adapted to surround a substrate support surface in a plasma etch reactor. During plasma etching of a substrate that is supported or clamped on the substrate support surface, the edge ring assembly can focus plasma over the substrate and/or focus RF power through the substrate. It is believed that the edge ring assembly can improve plasma etch performance and decrease wear of plasma reactor components. Further, the dielectric spacer ring and the edge ring can be disposable parts that can protect the substrate support and/or baseplate from plasma erosion.

Plasma chambers are generally used for etching layers of materials on substrates by supplying an etching gas comprising one or more gases to the chamber and applying energy to the etching gas to energize the gas into a plasma state. Various plasma chamber designs are known wherein radio frequency (RF) energy, microwave energy and/or magnetic fields can be used to produce and sustain medium density or high density plasma.

The edge ring assembly can be incorporated in inductively coupled, helicon, electron cyclotron resonance, parallel plate, or other types of plasma chambers. For instance, high density plasma can be produced in a transformer coupled plasma (TCP™) reactor, or in an electron cyclotron resonance (ECR) reactor. Transformer coupled plasma reactors, wherein RF energy is inductively coupled into the reactor, are available from Lam Research Corporation, Fremont, Calif. An example of a high-flow plasma reactor that can provide high density plasma is disclosed in commonly-owned U.S. Pat. No. 5,948,704, the disclosure of which is hereby incorporated by reference. Parallel plate reactors, electron-cyclotron resonance (ECR) reactors, and transformer coupled plasma (TCP™) reactors are disclosed in commonly-owned U.S. Pat. Nos. 4,340,462; 4,948,458; 5,200,232 and 5,820,723, the disclosures of which are hereby incorporated by reference.

By way of example, plasma can be produced in a parallel plate etch reactor such as the dual frequency plasma etch reactor described in commonly-owned U.S. Pat. No. 6,090,304, the disclosure of which is hereby incorporated by reference. A preferred parallel plate plasma etching chamber is a dual frequency capacitively coupled plasma reactor including an upper showerhead electrode and a lower electrode, the lower electrode (e.g., baseplate) having a substrate support such as an electrostatic chuck incorporated in an upper surface thereof. For purposes of illustration, embodiments of the edge ring assembly are described herein with reference to a parallel plate type plasma etch chamber.

A parallel plate plasma etch reactor is illustrated in FIG. 1. The plasma etch reactor 100 comprises a chamber 110, an inlet load lock 112, and an optional outlet load lock 114, further details of which are described in commonly-owned U.S. Pat. No. 6,824,627, which is hereby incorporated by reference in its entirety.

The load locks 112 and 114 (if provided) include transfer devices to transfer substrates such as wafers from a wafer supply 162, through the chamber 110, and out to a wafer receptacle 164. A load lock pump 176 can provide a desired vacuum pressure in the load locks 112 and 114.

A vacuum pump 172 such as a turbo pump is adapted to maintain a desired pressure in the chamber. During plasma etching, the chamber pressure is controlled, and preferably maintained at a level sufficient to sustain a plasma. Too high a chamber pressure can disadvantageously contribute to etch stop while too low a chamber pressure can lead to plasma extinguishment. In a medium density plasma reactor, such as a parallel plate reactor, preferably the chamber pressure is maintained at a pressure below about 200 mTorr (e.g., less than 100 mTorr or less than 50 mTorr).

The vacuum pump can be connected to an outlet in a wall of the reactor and can be throttled by a valve 173 in order to control the pressure in the chamber. Preferably, the vacuum pump is capable of maintaining a pressure within the chamber of less than 200 mTorr while etching gases are flowed into the chamber.

The chamber 110 includes an upper electrode assembly 120 including an upper electrode 125 (e.g., showerhead electrode), and a lower electrode assembly 140 including a baseplate (i.e., lower electrode) 160 and a substrate support surface 150 formed in an upper surface thereof. The upper electrode assembly 120 is mounted in an upper housing 130. The upper housing 130 can be moved vertically by a mechanism 132 to adjust the gap between the upper electrode 125 and the substrate support surface 150.

A etching gas source 170 can be connected to the housing 130 to deliver etching gas comprising one or more gases to the upper electrode assembly 120. In a preferred etch reactor, the upper electrode assembly comprises a gas distribution system, which can be used to deliver reactant and/or carrier gases to a region proximate to the surface of a substrate. Gas distribution systems, which can comprise one or more gas rings, injectors and/or showerheads (e.g., showerhead electrodes), are disclosed in commonly-owned U.S. Pat. Nos. 6,333,272; 6,230,651; 6,013,155 and 5,824,605, the disclosures of which are hereby incorporated by reference.

The upper electrode 125 preferably comprises a showerhead electrode, which includes apertures (not shown) to distribute etching gas therethrough. The showerhead electrode can comprise one or more vertically spaced-apart baffle plates that can promote the desired distribution of etching gas. The upper and lower electrodes may be formed of any suitable material such as graphite, silicon, silicon carbide, aluminum (e.g., anodized aluminum), or combinations thereof. A heat transfer liquid source 174 can be connected to the upper electrode assembly 120 and another heat transfer liquid source can be connected to the baseplate 160.

Commonly-owned U.S. Pat. No. 6,019,060, the disclosure of which is hereby incorporated by reference, discloses a plasma confinement ring assembly. Due to plasma confinement over the substrate undergoing etching, the pressure at the substrate surface may be higher than the vacuum pressure set for the reactor chamber. To maintain a low chamber pressure, preferably inert carrier gas is added to the chamber at a flow rate of from about 50 to 500 standard cubic centimeters per minute (sccm). The individual flow rates of the individual reactive components of an etching gas mixture typically range from about 1 to 200 sccm for a 200 mm substrate, and higher for larger substrates.

Plasma density refers to the density of positive ions within the plasma etching region. Generally, plasma density is a function of the power provided to the electrodes. A higher power tends to create a higher density of plasma that, depending on other parameters, may increase the etch rate of layers previously formed on a substrate by producing a large flux of ions to the substrate surface. Medium density plasma can be characterized as comprising an ion density of from about $10^{10}$ to $10^{11}$ ions/cm$^3$, while high density plasma typically can have an ion density of from about $10^{11}$ to $10^{12}$ ions/cm$^3$ or more.

In some embodiments, the upper electrode or the lower electrode can be the powered electrode, while the other of the lower electrode or the upper electrode is the electrically grounded (return path) electrode. In other embodiments, both the upper electrode and lower electrode can be powered, with the two electrodes powered out of phase with respect to voltage from each other. In a parallel plate reactor, a power source 178 can provide radio frequency (RF) power to the upper electrode 125 and/or baseplate (i.e., lower electrode) 160.

The reactor can be a single-frequency, dual-frequency or multi-frequency plasma reactor. In a dual-frequency plasma reactor, for example, plasma can be generated by supplying RF power at two different frequencies through match networks to the upper and/or lower electrodes. As an example, a lower frequency such as 2 MHz can be supplied to the lower electrode, and a higher frequency such as 27 MHz can be supplied to the upper electrode. Alternatively, the upper electrode can be electrically grounded and RF power at two or more different frequencies (e.g., about 10-60 MHz and less than about 10 MHz) can be supplied to the lower electrode.

A continuous or a discontinuous RF bias can be applied to the substrate during etching. The RF bias can determine the energy at which positive ion flux impinges the substrate surface. The RF power preferably ranges from about 50 to 3000 watts, and the RF bias power applied to the lower electrode can range from 0 to 3000 watts for a 200 mm substrate. Preferably, the lower electrode has a surface area so that the RF bias power can supply about 0-8 watts/cm$^2$ and preferably at least 2 watts/cm$^2$ of power to the substrate.

By supplying RF power to the lower electrode, a DC sheath voltage can be formed with respect to the surface of the substrate. The sheath voltage is a function of the bias power and is essentially independent of plasma generation. High bias powers generate large sheath voltages, and during etching can result in energetic ion bombardment of the substrate surface.

The gap width between the electrodes in a parallel plate reactor can affect the etch rate of a dielectric layer. Selection of a desired gap width depends in part upon the chamber pressure used during etching. Typically, at higher chamber pressures (e.g., from about 75 mTorr to 1 Torr), a preferred gap width is from about 1 to 1.5 cm. At lower chamber pressures (e.g., below about 75 mTorr), a higher gap width, such as a gap width of from about 1.3 to 2.5 cm, can be used. Also, the gap width can be selected as a function of the frequency applied to the electrodes. Generally, for the etching of dielectric layers, lower gap widths are more preferred for higher frequencies and higher gap widths are more preferred for lower frequencies. In a medium density parallel plate reactor, the gap between the upper electrode and the lower electrode supporting the substrate can be from about 1 to 2.5 cm.

Figure 2:
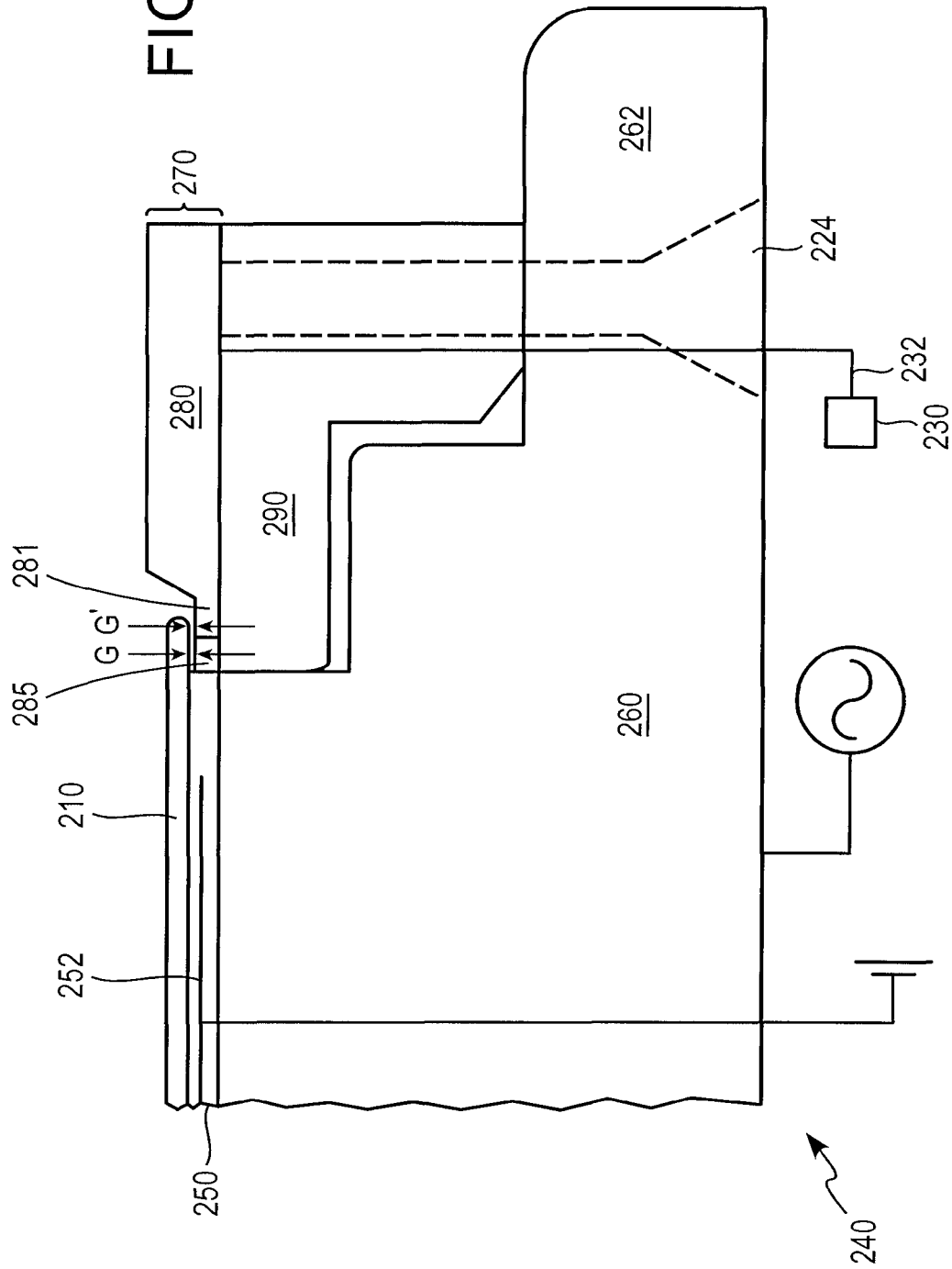
FIG. 2 shows a parallel plate plasma etch reactor comprising an edge ring assembly mounted on a coupling ring according to one embodiment.

Details of the lower electrode assembly 240, including an edge ring assembly 270 according to a first embodiment, are shown in FIG. 2. The lower electrode assembly 240 comprises a baseplate 260 having a flange 262, and a substrate support 250 such as an electrostatic chuck (ESC) comprising a substrate support surface 254 formed in an upper surface of the baseplate. The baseplate (lower electrode) can comprise a conductive material and the ESC can comprise a ceramic material having an electrode 252 buried therein. The ESC can be bonded to an upper surface of the baseplate. The lower electrode can be powered by an RF source and attendant circuitry for providing RF matching, etc. The lower electrode is preferably temperature controlled and may optionally include a heating arrangement. Substrate support surface 254 is adapted to support a single semiconductor substrate such as a 200 mm or 300 mm wafer.

As shown in the FIG. 2 embodiment, edge ring 280 and dielectric spacer ring 285 are supported on an upper surface of coupling ring 290 such as a quartz coupling ring, which rests on the flange 262 of baseplate 260. The coupling ring 290 can be supported on the baseplate with or without mechanical or adhesive fastening such as a plurality of bolts 224. A substrate 210 can be supported/clamped on the substrate support surface so as to preferably overhang the dielectric spacer ring 285 and at least a radially inner portion 281 of the edge ring 280.

The substrate support 250 preferably includes passages therein for supplying helium between substrate 210 and support surface 254 to cool substrate 210 during plasma etching thereof in an amount sufficient to prevent burning of photoresist on the substrate. Preferably, the substrate is maintained at a temperature of less than about 140° C. during plasma etching. In medium density plasma reactors, the substrate support is preferably cooled to a temperature of from about −20 to 80° C. so as to maintain the substrate at a desired temperature.

In order to maintain the substrate at a desired temperature, helium can be supplied at a pressure from about 1 to 30 Torr in the space between the substrate and the substrate support surface. Further, the substrate temperature may be controlled by regulating the level of the RF bias and the ESC temperature and other parameters as described herein. A method of controlling a temperature of a substrate by introducing a pressurized gas into a space between the substrate and the substrate support surface is disclosed in commonly-owned U.S. Pat. No. 6,140,612, the disclosure of which is hereby incorporated by reference.

The coupling ring 290 may optionally comprise an edge ring chuck (not shown) located in an upper surface thereof. The edge ring chuck, if provided, can be a monopolar or a bipolar chuck and can be supplied with DC power by a DC power supply using suitable electrical connections. The edge ring chuck can be used to secure the edge ring 280, such as a silicon edge ring to the coupling ring. Details of an electrostatically-clamped edge ring are disclosed in commonly-owned U.S. Pat. No. 6,475,336, the disclosure of which is hereby incorporated by reference.

The edge ring 280 can be made from a semiconducting or electrically conductive material such as silicon (e.g., single crystal silicon or polycrystalline silicon) or silicon carbide (e.g., chemical vapor deposited silicon carbide). Because the edge ring will be exposed directly to the plasma, preferred edge rings are made from high purity materials. Additional materials for the edge ring include aluminum oxide, aluminum nitride, silicon nitride, quartz, etc. The edge ring may be electrically floating or may be electrically coupled to a DC ground.

In order to reduce exposure of the substrate support and/or baseplate to the ions/reactive species in the plasma, preferably the substrate support is sized such that the substrate overhangs the substrate support surface. Referring still to FIG. 2, the substrate, which can overhang the substrate support surface by about 1 to 2 mm, overhangs both the dielectric spacer ring 285 and a radially inner portion 281 of the edge ring 280 (e.g., the dielectric spacer ring and a portion of the edge ring extend under the periphery of the substrate). Thus, the dielectric spacer ring preferably has a radial width that is less than the amount that the substrate overhangs the substrate support surface.

In a preferred edge ring assembly, the radially inner edge of the edge ring 280 contacts or is located close to the radially outer edge of the dielectric spacer ring 285, and the radially inner edge of the dielectric spacer ring 285 contacts or is located close to the outer edge of the substrate support and/or baseplate 260. By close to is meant that a gap (e.g., an annular gap) between the edge ring and the dielectric spacer ring or a gap between the dielectric spacer ring and the substrate support surface is less than about 0.25 mm, more preferably less than about 0.12 mm. Thus, the dielectric spacer ring and the edge ring substantially cover the top surface of the coupling ring 290 (or edge ring chuck if provided) so that exposure of the top surface of the coupling ring to reactive species and/or ions of the plasma can be reduced. In an embodiment, the dielectric spacer ring can be bonded to the coupling ring (i.e., an upper surface of the coupling ring can be bonded to a lower surface of the dielectric spacer ring).

A heat transfer gas such as helium can be used to improve thermal transfer between the edge ring assembly and the baseplate. The heat transfer gas can be supplied from gas source 230 via gas passage 232 to the interface between the edge ring assembly and the coupling ring 290 and/or to the interface between the coupling ring 290 and the baseplate 260. The gas passage 232 can extend through the baseplate 260 and coupling ring 290 at one or more locations spaced around the baseplate 260, e.g., extending through passages in bolts 224.

In embodiments where there is a gap between the substrate support and the dielectric spacer ring and/or between the dielectric spacer ring and the edge ring, helium flow in the gap(s) can reduce the entry of etching gas and/or volatile byproducts therein and thus reduce the deposition of polymer during plasma etching.

Referring still to FIG. 2, an inner surface of the edge ring spaced outwardly of the substrate is preferably shaped to form an angle with a plane substantially perpendicular to the substrate surface. Thus, a preferred edge ring comprises a radially inner portion 281 and a radially outer portion wherein the thickness of the radially inner portion is less than the thickness of the radially outer portion, and the thickness of the radially outer portion is greater than the thickness of the dielectric spacer ring. An upper surface of the dielectric spacer ring and an upper surface of the radially innermost portion of the edge ring are preferably positioned as close as possible to the underside of the substrate. According to a preferred embodiment, an upper surface of the dielectric spacer ring and a radially innermost upper surface of the edge ring are substantially co-planar and configured to underlie that portion of a substrate that overhangs the substrate support surface. Alternatively, an upper surface of the dielectric spacer ring can be higher or lower than an upper radially inner surface of the edge ring.

A clearance gap between the dielectric spacer ring and the substrate and between a radially inner portion of the edge ring and the substrate allows for thermal expansion of the dielectric spacer ring and the edge ring during plasma etching. Preferably, there is a clearance gap G between an upper surface of the dielectric spacer ring and the bottom surface of the substrate, and a clearance gap G' between an upper inner surface of the edge ring and the bottom surface of the substrate. It is desirable to provide sufficient clearance between the dielectric spacer ring and the substrate and between the edge ring and the substrate so that during etching thermal expansion of the dielectric spacer ring and/or the edge ring does not lift the substrate off the substrate support surface.

Preferred dielectric spacer rings have a width effective to electrically insulate the edge ring from the baseplate and a height effective to minimize the gap (G) between the dielectric spacer ring and the substrate during plasma etching of the substrate. By minimizing the gap G, polymer deposition on the underside or bevel edge of the substrate can be minimized.

The dielectric spacer ring can have a square cross section or a rectangular cross section. Exemplary dielectric spacer rings have a width of about 0.5 mm to 2.5 mm, more preferably about 0.8 to 1.2 mm, and a height of from about 1 to 3 mm, more preferably about 2.4 to 2.8 mm. According to a preferred embodiment, the dielectric spacer ring is adapted to fit beneath the overhang of a substrate mounted on the substrate support surface with a clearance gap (G) between the dielectric spacer ring and the substrate of less than about 0.25 mm. According to a further preferred embodiment, the distance between the plane of the substrate support surface and the plane of the upper surface of the dielectric spacer ring is preferably less than about 0.25 mm, and the distance between the plane of the substrate support surface and the plane of the upper surface of a radially inner portion of the edge ring is preferably less than about 0.25 mm.

Materials suitable for use as the dielectric spacer ring include ceramic materials such as silicon oxide (e.g., quartz) or aluminum oxide, and polymer materials such as DuPont® Vespel®, DuPont® Kapton®, and the like. A preferred dielectric spacer ring is made from quartz.

Figure 3:
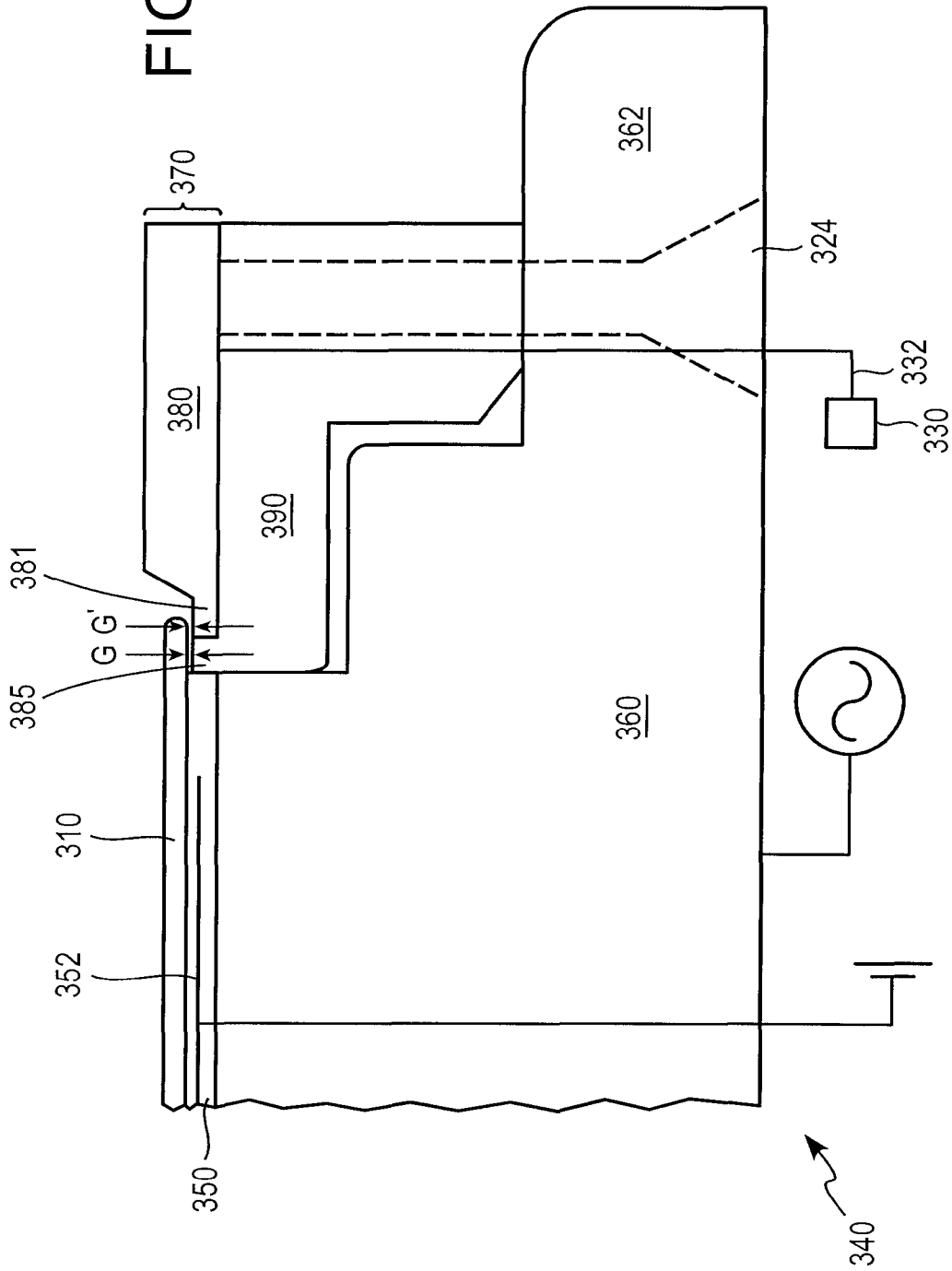
FIG. 3 shows a parallel plate plasma etch reactor comprising an edge ring assembly according to a further embodiment.

According to a further embodiment, an alternate geometry for the edge ring assembly comprises a modified coupling ring. Referring to FIG. 3, lower electrode assembly 340 comprises a modified coupling ring 390' including an axially upward extending portion 385 on an inner radial surface thereof. Compared with the FIG. 2 embodiment, which comprises a separate coupling ring and dielectric spacer ring, in the FIG. 3 embodiment the coupling ring and the dielectric spacer ring are configured as an integral, unitary part mounted on the baseplate 360. Thus, the axially upward extending portion 385 of the modified coupling ring is adapted to replace a separate dielectric spacer ring. The modified coupling ring 390' can be supported on baseplate 360 with or without mechanical or adhesive fastening.

In the FIG. 3 embodiment, edge ring 380, which can be substantially identical to the edge ring described in reference to the FIG. 2 embodiment, rests on an outer flanged portion of the modified coupling ring 390'. The modified coupling ring 390', which can be made of quartz, can rest on or be attached to (e.g., via bolts 324) a flanged portion 362 of baseplate 360.

A heat transfer gas such as helium can be used to improve thermal transfer between the modified coupling ring assembly and the baseplate. The heat transfer gas can be supplied from gas source 330 via gas passage 332 to the interface between the modified coupling ring 390' and the baseplate 360 and/or to the interface between the modified coupling ring 390' and the edge ring 380. The gas passage 332 can extend through the baseplate 360 and modified coupling ring 390' at one or more locations spaced around the baseplate 360, e.g., extending through passages in bolts 324.

An upper inner surface of the edge ring 380 spaced outwardly of the substrate is preferably shaped to form an angle with a plane substantially perpendicular to the substrate surface. Substrate support 350 can comprise an ESC having a substrate support surface 354 and an electrode 352 buried therein. The ESC can be bonded to an upper surface of the baseplate 360.

The radial inner surface 382 of edge ring 380 contacts or is located close to the radial outer surface 386 of the axially upward extending portion 385, and the radial inner surface 387 of the axially upward extending portion 385 contacts or is located close to the radially outer surface of the substrate support 350 and/or baseplate 360.

Both the radially inner portion 381 of the edge ring 380 and the upward axially extending portion 385 of the modified coupling ring 390' extend under an overhanging portion of substrate 310. According to a preferred embodiment, an upper surface of the axially upward extending portion 385 and an innermost upper surface of the edge ring are substantially co-planar and configured to underlie that portion of a substrate that overhangs the substrate support surface. Alternatively, an upper surface of the axially upward extending portion 385 of the modified coupling ring 390' can be higher or lower than an upper inner surface of the edge ring. Preferably, there is a clearance gap G between an upper surface of the axially upward extending portion 385 and the bottom surface of the substrate, and a clearance gap G' between an upper inner surface of the edge ring 380 and the bottom surface of the substrate.

According to a preferred embodiment, the axially upward extending portion 385 of the modified coupling ring 390' is adapted to fit beneath the overhang of a substrate mounted on the substrate support surface with a clearance gap (G) that is less than about 0.25 mm.

Exemplary operating conditions for a plasma etch reactor for etching a dielectric material such as $SiO_2$ are as follows: wafer diameter of about 200 mm or 300 mm; dielectric material thickness on the substrate of at least about 200 nm; dielectric material density of at least about 90% of theoretical density; lower electrode temperature of from about 0° C. to about 90° C.; chamber pressure of from about 0 Torr to 2 Torr, preferably up to about 200 mTorr; substrate temperature of from about 20° C. to 200° C., preferably 20° C. to 50° C.; etching gas flow rate of from about 10 sccm to 1,000 sccm; total dual-frequency power delivered between the upper electrode and the lower electrode of at least about 2,500 watts; and etch time for dielectric material of at least about 1 minute.

Various etching gases can be used to etch different dielectric materials. The etching gas can include one or more halogen-containing gases, one or more oxygen-containing gas and/or one or more nitrogen-containing gas. Typical etching gas mixtures can include, e.g., chlorine-containing gases such as, but not limited to, $Cl_2$, HCl and $BCl_3$; fluorine-containing gases such as, but not limited to, $CF_4$, $C_2F_6$, $C_3F_8$, $C_4F_8$, $CHF_3$, $CH_2F_2$, $CH_3F$, $NF_3$ and $SF_6$; oxygen-containing gases such as, but not limited to, $O_2$, CO, $H_2O$ and $SO_2$; nitrogen-containing gases such as, but not limited to, $N_2$, $NH_3$, and inert and other gases such as, but not limited to He, Ne, Kr, Xe, and Ar.

The etching gas mixture preferably includes an inert carrier gas. During the plasma etching of dielectric materials such as oxides, nitrides, or combinations thereof, the carrier gas can sputter the dielectric material, which can advantageously increase the overall etch rate. Heavy noble gases have a low ionization potential and form ions that can enhance the sputter rate at a given RF power. Moreover, the low ionization potential of the noble gas can help generate uniform plasma over the surface of the substrate. Exemplary carrier gases include helium, neon, argon, krypton and/or xenon. Argon is a preferred inert carrier gas. These and other gases may be used in combination in an etching gas mixture.

An example of a dielectric etch process carried out in a 2300 Exelan® or Exelan® HPT dual frequency medium density parallel plate plasma chamber available from Lam Research Corporation, Fremont, Calif. is set forth below wherein the etching gas chemistry in a main etch step is a mixture of octafluorocyclobutane ($C_4F_8$), difluoromethane ($CH_2F_2$), nitrogen ($N_2$) and argon (Ar). Additional etch steps, which may comprise additional etching gases, can be used. Although the optimal flow rates and ratios of the gas mixture may change depending on the choice of plasma etch reactor, substrate size, etc., in the case of etching a silicon oxide layer on a 300 mm silicon wafer, the individual constituents of the etching gas can be supplied to the reactor chamber at flow rates of 2 to 20 sccm hexafluoro-1,3-butadiene ($C_4F_6$); 2 to 20 sccm $C_4F_8$; 1 to 10 sccm $CH_2F_2$; 50 to 200 sccm tetrafluoromethane ($CF_4$); 50 to 200 sccm $N_2$; 200 to 800 sccm Ar; 100 to 400 carbon monoxide (CO); and 100 to 400 oxygen ($O_2$). During etching, the chamber pressure can be set at 1 to 500 mTorr, preferably 5 to 200 mTorr. The ratio of the flow rate of $C_4F_8$ to the flow rate of $CH_2F_2$ during the main etch step can be 0.5 to 4, preferably 1 to 3 to achieve a desired degree of selectivity with respect to other layers of the etched structure.

During dielectric etching, the upper electrode is preferably electrically grounded and RF power at one or more power levels (and frequencies) is supplied to the lower electrode. Further, the upper electrode preferably comprises a showerhead electrode that can comprise a dual gas feed configuration wherein the showerhead electrode comprises two or more gas feed through zones, such as a center zone and radial (edge) zone surrounding the center zone. In a dual gas feed arrangement, the flow rate of etching gas though a center zone and through a surrounding circumferentially extending edge zone can be controlled (i.e., the flow rate ratio can be controlled). An example of a plasma etch reactor comprising a showerhead electrode having a dual gas feed arrangement is disclosed in commonly-owned U.S. Pat. No. 6,245,192, the disclosure of which is herein incorporated by reference.

The dielectric layer can comprise silicon nitride, un-doped or doped silicon oxide (such as fluorinated silicon oxide), spin-on glass, silicate glasses such as boron phosphate silicate glass (BPSG) or phosphate silicate glass (PSG), un-doped or doped thermally grown oxide, un-doped or doped tetraethoxyorthosilicate (TEOS) deposited silicon oxide, and inorganic or organic low dielectric constant (i.e., low-k) layers. Such layers can form part of a damascene structure. Dopants for dielectric materials can include, but are not limited to, boron, fluorine, phosphorus and/or arsenic.

The dielectric layer can be formed on a semiconductor substrate or the dielectric layer can be formed on a conductive or semiconductive layer. For instance, the dielectric layer can overlie a conductive or semiconductive layer such as polycrystalline silicon, a metal layer comprising aluminum, copper, titanium, tungsten, molybdenum, nitrides such as titanium nitride, silicides such as titanium silicide, cobalt silicide, tungsten silicide, molybdenum silicide, and the like.

FIG. 4 shows a variation on how the edge ring assembly can be mounted on the baseplate rather than on a coupling ring. As shown in FIG. 4, the dielectric spacer ring 485 and edge ring 480 of an edge ring assembly 470 are supported on a surface of the baseplate 460 and a substrate 410 is supported on a support surface 454 of substrate support 450, which is incorporated in a central portion of the baseplate 460 such that the surface of the substrate support is vertically higher than upper surfaces of the components of the edge ring assembly underlying a substrate overhang. To promote heat transfer from the edge ring assembly 470 to the baseplate 460, a gas supply 430 can supply a heat transfer gas through one or more passages 432 into an interface between the components of the edge ring assembly and the baseplate and/or substrate support. A preferred heat transfer gas is helium.

It is believed that the edge ring assembly can be used to achieve more uniform plasma etching of semiconductor substrates. In particular, the edge ring assembly can be used to manipulate the RF impedance path near the edge of a substrate. The RF impedance path can be controlled by the choice of materials for the dielectric spacer ring and the edge ring.

Generally, the RF impedance path from a powered lower electrode through both the substrate support and the substrate to the plasma can be different than the RF impedance path from a peripheral portion of the lower electrode to the plasma. Edge effects from the substrate support and the substrate can result in a non-uniform plasma density across the substrate, which can result in non-uniform etching.

Without wishing to be bound by theory, it is believed that the dielectric spacer ring reduces RF coupling into the edge ring and increases RF coupling into the periphery of the substrate. By increasing RF coupling into the periphery of the substrate, the etch rate at the periphery of the substrate can be increased. Incorporation of the dielectric spacer ring around the substrate support also decreases the buildup of polymer at the underside and along the edge of the substrate. Such polymer is typically generated during the etch steps (e.g., as a byproduct of etching photoresist and/or dielectric material).

The buildup of bevel polymer (e.g., polymer at the underside and or edge of the substrate) was measured after completing dielectric etching. Without incorporating a dielectric spacer ring around the substrate support, 55-65 nm of bevel polymer buildup was observed after completing the etch process for standard over-etch times of 10 seconds (first over-etch) and 30 seconds (second over-etch). Increased bevel polymer buildup was observed by increasing the over-etch times.

The use of a dielectric spacer ring resulted in a decrease in the amount of bevel polymer buildup. By incorporating a dielectric spacer ring (2.62 mm height×0.965 mm width) between the edge ring and the substrate support, the substrate was substantially free of bevel polymer after the standard over-etch as well as after a 50% increase in the standard over-etch times (i.e., a first over-etch of 15 seconds and a second over-etch of 45 seconds). After further increases in the over-etch times, however, bevel polymer build-up was observed. Table 1 summarizes the extent of bevel polymer buildup (measured in nanometers, nm) as a function of over-etch times in conjunction with the preferred dielectric etch process.

TABLE 1

Effect of dielectric spacer ring on bevel polymer buildup

| Overetch Condition | Bevel Polymer (without dielectric spacer ring) | Bevel Polymer (with dielectric spacer ring) |
| --- | --- | --- |
| Standard | 55-65 nm | None |
| +50% | >65 nm | None |
| +75% | >65 nm | ~16 nm |
| +100% | >65 nm | ~30 nm |
| +200% | >65 nm | ~75 nm |

A preferred method of etching a semiconductor substrate in a plasma etching chamber comprises mounting a substrate on a support surface of a substrate support within the plasma etching chamber, supplying etching gas into the chamber, energizing the etching gas so as to generate plasma adjacent an exposed surface of the substrate and etching the substrate with the plasma, wherein an edge ring assembly comprising an edge ring and a dielectric spacer ring surrounds the substrate support. The edge ring surrounds the substrate support and the dielectric spacer ring is interposed between the edge ring and the substrate support. Because the dielectric spacer ring is a consumable part, it can be removed from the chamber and replaced with another dielectric spacer ring after etching a predetermined number of semiconductor substrates.

While the electrodes have been referred to and depicted in the Figures as "upper" or "lower" electrodes, a plasma etching chamber having an edge ring assembly incorporated therein can be constructed such that the substrate being etched is held (i.e., clamped) with its processed side facing down rather than up. Further, the edge ring assembly can be used to etch non-circular substrates.

The terms "comprises" and "comprising" as used herein are taken to specify the presence of stated features, steps, or components; but the use of these terms does not preclude the presence or addition of one or more other features, steps, components, or groups thereof.

All of the above-mentioned references are herein incorporated by reference in their entirety to the same extent as if each individual reference was specifically and individually indicated to be incorporated herein by reference in its entirety.

While the invention has been described with reference to preferred embodiments, it is to be understood that variations and modifications may be resorted to as will be apparent to those skilled in the art. Such variations and modifications are to be considered within the purview and scope of the invention as defined by the claims appended hereto.

We claim:

1. An edge ring assembly adapted to surround a substrate support surface in a plasma etching chamber comprising:
    an edge ring dimensioned so as to underlie a substrate located on a substrate support surface in the chamber and provide a clearance gap between a lower surface of the substrate and an upper surface of the edge ring, the gap allowing for thermal expansion during plasma etching and minimizing polymer deposition on the underside or bevel edge of the substrate; and
    a dielectric spacer ring between the edge ring and the substrate support surface dimensioned so as to provide a clearance gap between a lower surface of a substrate located on the substrate support surface and an upper surface of the dielectric spacer ring wherein the dielectric spacer ring comprises an axially upward extending portion formed on a radially inner surface of a coupling ring, and the coupling ring includes bolt holes therein which receive bolts attaching the coupling ring to a temperature controlled and radiofrequency powered baseplate beneath an electrostatic chuck comprising the substrate support, the gap allowing for thermal expansion during plasma etching and minimizing polymer deposition on the underside or bevel edge of the substrate;
    wherein the upper surface of the dielectric spacer ring and an innermost upper surface of the edge ring are substantially co-planar when the dielectric spacer ring and the edge ring are mounted in the chamber; a radially outer portion of the edge ring is thicker than the dielectric spacer ring; the edge ring includes an upper inner surface which is inclined and spaced outwardly from the substrate; the coupling ring and edge ring have the same outer diameter; and the dielectric spacer ring electrically insulates the edge ring from the baseplate.

2. The edge ring assembly of claim 1, wherein a radial gap between the edge ring and the dielectric spacer ring and/or a radial gap between the dielectric spacer ring and the substrate support surface is less than 0.25 mm.

3. The edge ring assembly of claim 1, wherein the edge ring is made from silicon, silicon carbide, aluminum oxide, aluminum nitride, silicon nitride, quartz or combinations thereof and the coupling ring is made of quartz.

4. A substrate support comprising a baseplate and the edge ring assembly of claim 1, wherein at least one gas passage extends through the baseplate, the gas passage being adapted to supply a heat transfer gas to an adjacent surface of the edge ring and/or the dielectric spacer ring.

5. A plasma etching chamber including the edge ring assembly of claim 1 comprising:
    a substrate support having a substrate support surface and a baseplate;
    the edge ring dimensioned so as to underlie a substrate and provide a clearance gap between a lower surface of a substrate located on the substrate support surface in the chamber and an upper surface of the edge ring; and
    the dielectric spacer ring between the edge ring and the substrate support surface dimensioned so as to provide a clearance gap between a lower surface of a substrate located on the substrate support surface and an upper surface of the dielectric spacer ring.

6. The plasma chamber of claim 5, wherein the distance between a plane of the substrate support surface and a plane of the upper surface of the dielectric spacer ring is less than about 0.25 mm, and the distance between a plane of the substrate support surface and a plane of the upper surface of a radially inner portion of the edge ring is less than about 0.25 mm.

7. The plasma chamber of claim 5, wherein the plasma etching chamber comprises a parallel plate reactor having an upper showerhead electrode facing the substrate support.

8. The plasma chamber of claim 5, wherein the substrate support comprises an RF driven electrode and/or an electrostatic chuck.

9. The plasma chamber of claim 5, wherein the edge ring assembly is adapted to reduce at least one of (i) RF coupling between the edge ring and baseplate, (ii) arcing between edge ring and baseplate, and (iii) polymer deposition on an underside and/or edge of a substrate supported on the substrate support surface.

10. A method of etching a layer formed on a semiconductor substrate in the plasma etching chamber of claim 5, the method comprising the steps of:
    supporting the semiconductor substrate on the substrate support surface positioned inside the chamber;
    supplying etching gas to the chamber;
    forming a plasma adjacent an exposed surface of the substrate; and
    etching one or more layers formed on the semiconductor substrate with the plasma.

11. The method of claim 10, wherein the dielectric spacer ring reduces RF coupling into the edge ring and increases RF coupling into the periphery of the substrate so as to increase the etch rate at the periphery of the substrate and decrease polymer buildup at the underside and along the outer edge of the substrate compared to etching without the dielectric spacer ring.

12. The method of claim 10, wherein the etching includes an overetching step and the substrate is substantially free of bevel polymer after completion of the overetching.

13. The method of claim 10, wherein the etching comprises etching a dielectric layer on the substrate.

14. A method of replacing the dielectric spacer ring in the plasma etching chamber of claim 5, comprising removing the dielectric spacer ring from the chamber and replacing it with another dielectric spacer ring after etching a predetermined number of semiconductor substrates.

15. The edge ring assembly of claim 1, wherein the entire lower surface of the edge ring is supported on the coupling ring.

* * * * *